United States Patent
Steenbrink et al.

(10) Patent No.: US 8,890,095 B2
(45) Date of Patent: Nov. 18, 2014

(54) RELIABILITY IN A MASKLESS LITHOGRAPHY SYSTEM

(75) Inventors: Stijn Willem Herman Karel Steenbrink, CJ Delft (NL); Pieter Kruit, EB Delft (NL); Marco Jan-Jaco Wieland, CJ Delft (NL)

(73) Assignee: Mapper Lithography IP B.V., CJ Delft (NL)

( * ) Notice: Subject to any disclaimer, the term of this patent is extended or adjusted under 35 U.S.C. 154(b) by 382 days.

(21) Appl. No.: 11/492,572

(22) Filed: Jul. 24, 2006

(65) Prior Publication Data
US 2007/0029507 A1 Feb. 8, 2007

Related U.S. Application Data

(60) Provisional application No. 60/702,561, filed on Jul. 25, 2005.

(51) Int. Cl.
| H01J 37/15 | (2006.01) |
| G03F 7/20 | (2006.01) |
| B82Y 40/00 | (2011.01) |
| H01J 37/317 | (2006.01) |
| B82Y 10/00 | (2011.01) |

(52) U.S. Cl.
CPC ......... *H01J 37/3177* (2013.01); *G03F 7/70425* (2013.01); *B82Y 40/00* (2013.01); *H01J 2237/31757* (2013.01); *B82Y 10/00* (2013.01); *G03F 7/70291* (2013.01)
USPC .................................................... 250/492.22

(58) Field of Classification Search
USPC ................... 250/491.1, 492.1, 492.2, 492.21, 250/492.23; 359/197.1, 204.4, 204.2; 378/34; 355/53; 101/450.1, 470, 471
See application file for complete search history.

(56) References Cited

U.S. PATENT DOCUMENTS

| 4,467,211 | A  | * | 8/1984 | Smith et al. ................ 250/492.2 |
| 5,757,019 | A  |   | 5/1998 | Murai et al. |
| 6,617,587 | B2 | * | 9/2003 | Parker et al. .................. 250/398 |
| 6,618,185 | B2 | * | 9/2003 | Sandstrom .................... 359/292 |
| 2003/0085360 | A1 |   | 5/2003 | Parker et al. |

(Continued)

FOREIGN PATENT DOCUMENTS

| JP | 08-250404 | 9/1996 |
| JP | 2004-200549 | 7/2004 |

OTHER PUBLICATIONS

Translation of Japanese Office Action dated Sep. 13, 2011 in connection with JP2008-523818 (3 pages).

*Primary Examiner* — Brooke Purinton
(74) *Attorney, Agent, or Firm* — Blakely Sokoloff Taylor & Zafman

(57) ABSTRACT

A maskless lithography system for transferring a pattern onto a surface of a target. At least one beamlet optical unit generates a plurality of beamlets. At least one measuring unit measures properties of each beamlet. At least one control unit generates and delivers pattern data to the beamlet optical unit. The control unit is operationally coupled to the measuring unit for identifying invalid beamlets which have a measured property value outside a predefined range of values for the property. At least one actuator induces a shift of the beamlet optical unit and the target with respect to one another. The actuator is operationally coupled with the control unit. The control unit determines the shift, positioning valid beamlets at the position of the invalid beamlets, thus replacing the invalid beamlets with valid beamlets.

18 Claims, 7 Drawing Sheets

(56) References Cited

U.S. PATENT DOCUMENTS

| | | |
|---|---|---|
| 2003/0099026 A1 | 5/2003 | Sandstrom |
| 2003/0155534 A1* | 8/2003 | Platzgummer et al. .. 250/492.22 |
| 2004/0135983 A1* | 7/2004 | Wieland et al. ................. 355/67 |
| 2005/0072941 A1* | 4/2005 | Tanimoto et al. ........ 250/492.22 |
| 2005/0181584 A1* | 8/2005 | Foad et al. ................. 250/492.2 |

* cited by examiner

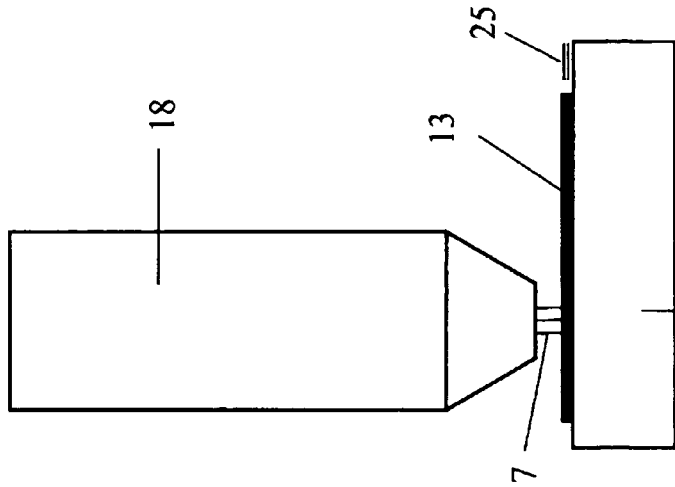
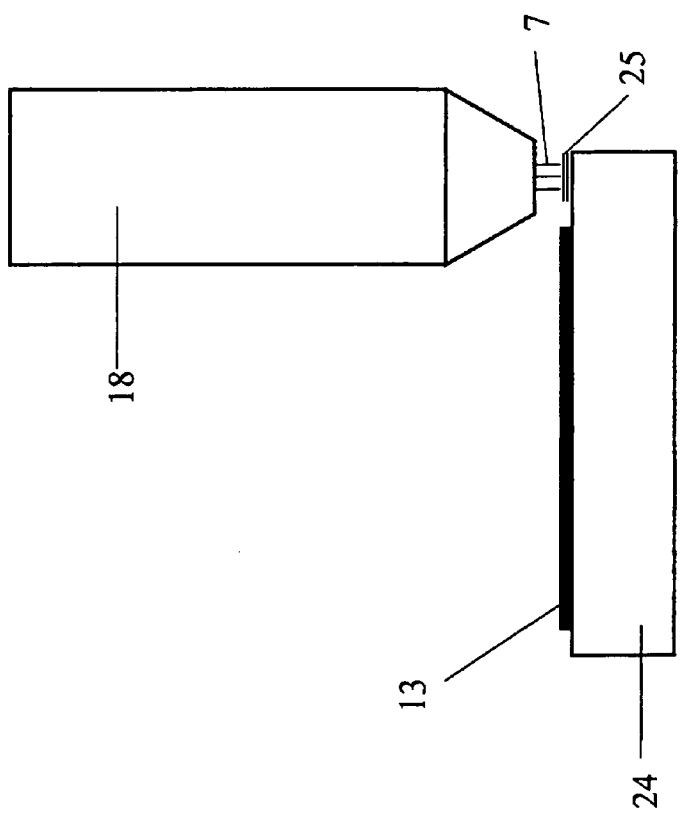

RELIABILITY IN A MASKLESS LITHOGRAPHY SYSTEM

The present patent application is a non-provisional application claiming the prioirty of a provisional application of Application No. 60/702.561, filed Jul. 25, 2005.

BACKGROUND

The invention pertains to a maskless lithography system for transferring a pattern onto the surface of a target, and to a method for transferring a pattern onto a surface of a target using a maskless lithography system.

Ups to now, most commercially available lithography systems use a mask or reticle to transfer a pattern onto a surface of a target. For each new design, however, such a reticle has to be produced. Especially with ever increasing resolution requirements, now in the order of 100 nm, this has become more and more challenging. Furthermore, it reduces flexibility in chip production processes. Therefore, maskless lithography systems are being developed.

A certain class of these lithography systems is multi-beamlet systems. In such maskless lithography systems using a plurality of beamlets for transferring a pattern onto a surface of a target, a beamlets generator generates a plurality of beamlets, such as electron beamlets, ion beamlets, x-ray beamlets, or the like. These beamlets are usually focused onto the surface or a target and together or individually scanned over its surface. In these systems, the designed spot size of each beamlet usually is smaller than 50 nm, and in the order of 10,000 beamlets is to be used.

In case one or more beamlets should fail, however, as statistically becomes likely with such a large number of beamlets, entire wafers are rendered unusable at once, which has a large effect on costs and manufacturing time of wafers. This can in fact undo a considerable part of the advantage of a so-called massive multi-beamlet lithography system as regards throughput.

SUMMARY OF THE INVENTION

An objective of the current invention is to improve lithography systems described above, in particular to mitigate at least part of the effect of part of the disadvantages mentioned.

An objective of the current invention is further to reduce the effect of beamlet failure in these systems.

A further objective is to provide a reliable lithography system, or to improve the reliability of lithography systems described above.

A further objective of the current inventions is to provide a versatile system that has various possibilities of correcting beamlet failure. A further objective is to design such a system that can combine these possibilities.

The invention therefore provides a maskless lithography system for transferring a pattern onto a surface of a target, comprising:

at least one beamlet optical unit for generating a plurality of beamlets;

at least one measuring unit for measuring properties of each beamlet;

at least one control unit for generating and delivering pattern data to said beamlet optical unit, said control unit being operationally coupled to said measuring unit for identifying invalid beamlets which have a measured property value outside a predefined range of values for said property;

at least one actuator for inducing a shift of said beamlet optical unit and said target with respect to one another, wherein said actuator is operationally coupled with said control unit, said control unit determining said shift, positioning valid beamlets at the position of said invalid beamlets, thus replacing said invalid beamlets with valid beamlets.

Using such an actuator that causes a shift of beamlets and target with respect to one another, it has become possible to compensate for failing, i.e. invalid, beamlets. This solution of the problems mentioned above does not need to lead to an increase in apparatus complexity. Furthermore, with the apparatus of the invention, it is possible to correct for invalid beamlets and still attain a commercially acceptable processing speed. This can for instance be done in the following way. In a particular embodiment, after shifting, the lithography system of the invention scans the beamlets over the surface once more. If only those beamlets that take the position of failing or invalid beamlets are fired, for instance, than it has become possible to write those parts of the pattern that would otherwise not have been written due to failure of only some of the beamlets. The lithography system of the invention thus allows the scan line of a beamlet that is out of specification to be written by a beamlet that is according to specification. In an embodiment, the system or, in particular the control unit, can switch of certain selected beamlets including the invalid beamlets, or the beamlets which are invalid, during an exposure scan.

In an embodiment of the maskless lithography system of the invention, said control unit is adapted for storing information identifying invalid beamlets which have measured properties which are outside a predefined range of properties.

In an embodiment of the maskless lithography system of the invention, said said beamlet optical unit comprises:

a beamlet generator for generating a plurality of electron beamlets, and at least one modulator unit, aligned with said beamlets for modulating the intensity of each of said beamlets, and wherein said control unit is operationally coupled to said modulator unit for generating and delivering pattern data to said modulator unit.

In an embodiment of the maskless lithography system of the invention, said said beamlet optical unit comprises:

a beamlet generator for generating a plurality of electron beamlets, and at least one scanner for scanning said beamlets over said surface, and wherein said control unit is operationally coupled to said scanner for generating and delivering pattern data to said scanner. In such an embodiment, it is for instance possible write a pattern onto the surface of the substrate in w first writing scan, to subsequently perform the shift, and to do an additional scan to write the part of the pattern that was not yet written due to failure of beamlets. In such a system and method, preferably the invalid beamlets are completely switched off.

In an embodiment of the maskless lithography system of the invention, said said beamlet optical unit comprises:

a beamlet generator for generating a plurality of electron beamlets;

at least one scanner for scanning said beamlets over said surface, and at least one modulator unit, aligned with said beamlets for modulating the intensity of each of said beamlets, and wherein said control unit is operationally coupled to said modulator unit and said scanner for generating and delivering pattern data to said modulator unit and said scanner.

In an embodiment of the maskless lithography system of the invention, said control unit comprises an optical transmitter for generating at least one light beam carrying said pattern information and projecting said at least one light beam into said beamlet optical unit.

In an embodiment of the maskless lithography system of the invention, said beamlet optical unit is adapted for producing beamlets are regularly spaced and said actuator is adapted for inducing a shift which is an integer times a mutual distance of two beamlets.

In an embodiment of the maskless lithography system of the invention, said control unit comprises a calculator for calculating said shift from said information identifying invalid beamlets, and calculating new pattern data for providing the pattern data of the invalid beamlets to the valid beamlets replacing the invalid beamlets.

In an embodiment of the maskless lithography system of the invention, said actuator shifts the position of said beamlet optical unit and said target with respect to one another.

In an embodiment of the maskless lithography system of the invention, said actuator shifts the position of said beamlet optical unit with respect to said target surface.

In an embodiment of the maskless lithography system of the invention, said control unit comprises at least one data storage for storing the pattern data, at least one readout unit for reading out the pattern data from the data storage, at least one data converter for converting the pattern data read out from the data storage into at least one modulated light beam, and at least one optical transmitter for transmitting said at least one modulated light beam to said beamlet optical unit, wherein lithography system is further provided with a second actuator for shifting the position of said transmitter and said electron optical unit with respect to one another.

In an embodiment of the maskless lithography system of the invention, said modulator unit comprises a plurality of modulators, each modulator provided for modulating a beamlet, and said transmitter couples said at least one modulated light beam to each modulator, wherein said actuator shifts the position of said transmitter and said modulator unit with respect to one another such that said transmitter couples said at least one modulated light beam with respect to other modulators of the modulator unit than before said shift.

In an embodiment of the maskless lithography system of the invention, said lithography system further comprises a first memory for storing information allowing identification of said invalid beamlets of said beamlet electron optical unit.

In an embodiment of the maskless lithography system of the invention, said control unit is adapted for modifying the order in which the pattern data will be read from the data storage.

In an embodiment of the maskless lithography system of the invention, said control unit comprises a first data storage for storing said pattern data and a second data storage for storing a copy of said pattern data of said first data storage, and processing means for modifying said pattern data in said second data storage, based upon said information identifying invalid beamlets.

In an embodiment of the maskless lithography system of the invention, said control unit is adapted for providing control signals to said beamlet optical unit for switching off the invalid beamlets when writing the pattern.

In another aspect the invention relates to a maskless lithography system for transferring a pattern onto the surface of a target, comprising:

at least one first beamlet generator for generating a plurality of beamlets;

at least one second beamlet generator for generating a plurality of beamlets;

at least one modulator unit comprising a plurality of modulators, said modulator unit aligned with said first beamlet generator, for modulating each of the beamlets of said first beamlet generator;

at least one beamlet controller for controlling the scanning of each beamlet of said first beamlet generator;

at least one control unit for generating and delivering pattern data to said modulator unit and for controlling said beamlet controller;

wherein said first and second beamlet generator are positioned with respect to one another to allow projection of said beamlets of said second beamlet generator on the same position as said beamlets of said first beamlet generator.

In an embodiment of this maskless lithography system, said modulator unit comprises further modulators, aligned with said second beamlet generator for also modulating each of the beamlets of said second beamlet generator.

In an embodiment of the further lithography system, the beamlet controller is further adapted for controlling the scanning of each beamlet of said second beamlet generator.

The invention further relates to a maskless lithography system for transferring a pattern onto the surface of a target, comprising:

at least one first beamlet generator for generating a plurality of beamlets;

at least one second beamlet generator for generating a plurality of beamlets;

at least one modulator unit comprising a plurality of modulators, said modulator unit aligned with said first beamlet generator, for modulating each of the beamlets of said first beamlet generator;

at least one beamlet controller for controlling the scanning of each beamlet of said first beamlet generator;

at least one control unit for generating and delivering pattern data to said modulator unit and for controlling said beamlet controller;

wherein said lithography system further comprises at least one actuator for displacing said first beamlet generator and said second beamlet generator with respect to one another to allow projection of said beamlets of said second beamlet generator on the same position on said surface as said beamlets of said first beamlet generator.

In an embodiment of this maskless lithography system, said modulator unit comprises further modulators, aligned with said second beamlet generator for also modulating each of the beamlets of said second beamlet generator.

In an embodiment of this maskless lithography system, said beamlet controller is further adapted for controlling the scanning of each beamlet of said second beamlet generator.

The invention further relates to a method for transferring a pattern onto the surface of a target using the maskless lithography system of any one of the preceding claims, wherein said plurality of beamlets is scanned over an area of said surface of said target, said actuator induces said shift, and said plurality of beamlets is scanned over said area again.

The invention further relates to a method for transferring a pattern onto a surface of a target using a maskless multi-beamlet lithography system, comprising the steps of generating a plurality of beamlets;

measuring properties of each beamlet;

transferring said pattern onto said surface by scanning valid beamlets which have measured beamlet properties which are within a predefined range of properties over said surface and preventing invalid beamlets which have measured beamlet properties which are outside a predefined range of properties from reaching said surface, thus leaving unwritten pattern elements;

shifting said surface and at least part of said lithography system with respect to one another, to replace each invalid beamlet with a valid replacement beamlet, and transferring said unwritten pattern onto said surface by scanning the valid replacement beamlets over said surface.

In an embodiment this method further comprises the step of:

providing a controller with pattern data;

storing information for identifying said invalid beamlets;

separately modulating each beamlet in dependence of said pattern data by means of a modulator which is controlled by said controller;

scanning said plurality of beamlets over said surface by means of a scanner in a scanning direction while relatively advancing said target in another direction than said scanning direction, in casu perpendicular thereto;

performing an additional scan over said surface after having performed said shift.

Such shift is performed preferably only in case of detection of invalidly effected pattern data, i.e. invalidly effected on to a sensor for sensing the validity of beamlets included in the system. Valid beamlets are subsequently used for scanning pattern data of for said invalid detected beamlets over the position thereof during said additional scan.

In an embodiment this method the magnitude of said shift is such that a valid beamlet takes the position of each invalid beamlet.

In an embodiment this method said shift is an integer times the mutual distance of two beamlets.

In an embodiment this method the number beamlets generated for transferring a pattern is less than the number of beamlets that can be generated within the lithographic system. The additional number of beamlet positions in a system thus arranged is less than 1%. For instance in a system according to the invention having an operational base of 13000 beamlets, 200 additional beamlets may be generated. These beamlets are equally distributed at lateral sides of a so called scanning slit comprising said operational base number of beamlets. Such limited inclusion remarkably enhances the chance of successfully shifting towards said additional scan setting, i.e. valid beamlets over all of the beamlets that were determined as invalid before or after the preceding scan.

In an embodiment with the second beamlet generator mentioned above, which is positioned or which allows to be positioned that way, it is possible to write pattern parts which would otherwise not have been written, resulting in a production failure or delays in production due to maintenance. A further advantage of this embodiment of the invention is that it may enlarge the time interval between maintenance. The second beamlet generator also allows other corrections to be made, and allows correction of other errors.

The above-described features of the lithography system and method can be combined, in order to further improve the lithography system of the invention or mentioned above.

DRAWINGS

The invention will be further elucidated in the following embodiments of a maskless lithography system according to the current invention, in which:

FIG. 7A shows the step of measuring beamlet properties before writing;

FIG. 7B shows the process of writing a pattern on a wafer, and

DETAILED DESCRIPTION OF THE INVENTION

Figure 1:
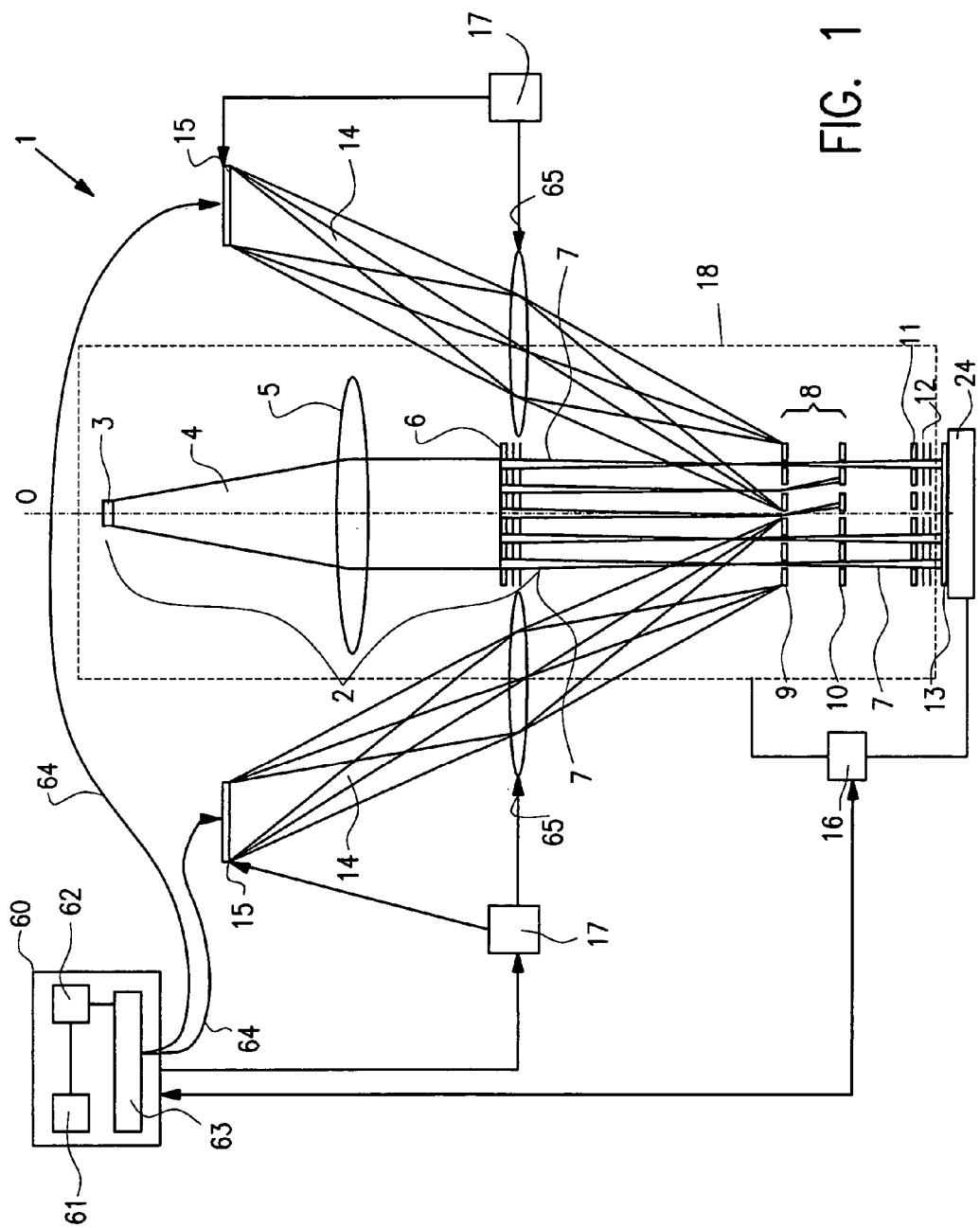
FIG. 1 shows a schematic side cross sectional view of a lithography system of the current invention.

In FIG. 1, an overall side view is shown of a lithography system that can be used in the current invention.

The lithography system 1 comprises an electron optical unit 18, indicated with the stripped line, comprising a beamlet generator 2 with a source 3 generating a beam 4, a collimating optical system, represented by lens 5, for collimating beam 4, and beam splitter 6 for splitting the beam into a plurality of beamlets 7.

The resulting plurality of substantially parallel beamlets 7 is directed to modulator unit 8, that comprises an array of deflectors 9 and a beamlet stop array 10 for stopping each deflected beamlet.

Using electrostatic deflectors in the modulator unit 8, beamlets 7 are deflected away from the optical axis 0 of the system and beamlets 7' pass the modulator arrays undeflected.

The beamlets 7' passing stop array 10 are deflected at deflector array 11 in a first writing direction (scan direction) and the cross section of each beamlet is reduced using projection lenses 12. During writing, the target surface 13 moves with respect to the rest of the system in a second writing direction.

The lithography system furthermore comprises a control unit 60 comprising data storage 61, a read out unit 62 and data converter 63. The control unit 60 may be located remote from the rest of the system, for instance outside the inner part of a clean room. Using optical fibers 64, modulated light beams holding pattern data are transmitted to a projector 65 which projects the ends of the fibers (schematically depicted in plate 15) into the electron optical unit 18, here on to the modulation array 9. In this embodiment, the free space coupling used to transmit pattern data to the electron optical unit 18 provided certain advantages in view of the current invention that will be explained.

Modulated light beams 8 from each optical fiber end are projected on a light sensitive element of a modulator on the modulator array 9. In particular, ends of the fibers are projected on the modulator array 9. Each light beam 14 holds a part of the pattern data for controlling one or more modulators.

Various embodiments of such a lithography system of FIG. 1 are further disclosed in WO-A2-2004/038509, which is incorporated by reference as if fully set forth. In that application, various ways of delivering pattern information to the electron optical unit 18 using one or more light beams were described.

The lithography system additionally comprises an actuator 16, which can displace the target surface 13 and the electron optical unit 18 of the lithography system with respect to one another. In particular, when the beamlets are regularly spaced, this actuator 16 is adapted for mutually displacing or shifting an integer times the mutual distance of two beamlets. In an embodiment, the actuator is a stage 24, which is used to displace the target 13 with respect to the electron optical unit 18 of the lithography system. To that end, the stage 24 is operationally coupled to the control unit 60.

If one of the beamlets impinging on target surface 13 is out of specified range, for instance because its intensity, position, size or homogeneity (all of these parameters considered in time and/or spatially) is out of a specified range, part of the pattern is incorrect.

In order to compensate for failure of beamlets or for beamlets that do not operate within specs, it was found that there are two main approaches that may be combined to further improve flexibility of the system. Both approaches, however, lead to an increase in system complexity. It was found that the additional features needed for increasing reliability could also be used for improving other processing aspects. Furthermore, combining approaches can result in a better reliability with less increase of system complexity.

A first approach is to scan the same surface of a substrate two or more times.

Another approach is to increase the number of beamlets by adding redundant beamlets to the lithography system.

Figure 2:
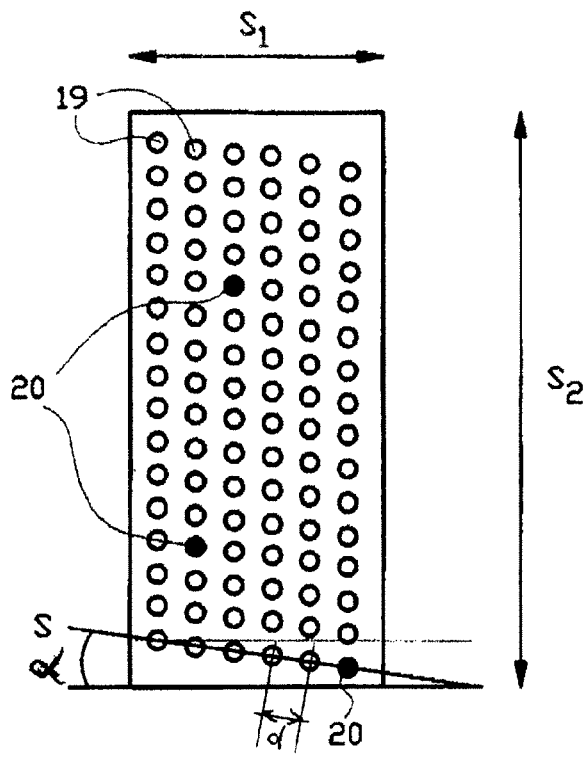
FIG. 2 shows a view of an part of an electro-optical slit.

FIG. 2 shows the mutual position of beamlet in their neutral position on a wafer, indicating the distribution of beamlets. Here an open circle indicates a beamlet that is within spec, and a closed or filled circle indicated a beamlet that is out of spec. The line s connecting the beamlets is at a small angle $\alpha$ with respect to scanning direction S1 in order to assure that the entire area of the surface can be covered with the beamlets. Scanning direction S1 is the displacement of the electron optical system with respect to the substrate surface. Further indicated in FIG. 2 is scan direction S2 of each individual beamlet. In FIG. 2, there are three beamlets 20 that are out of specification.

Figure 3:
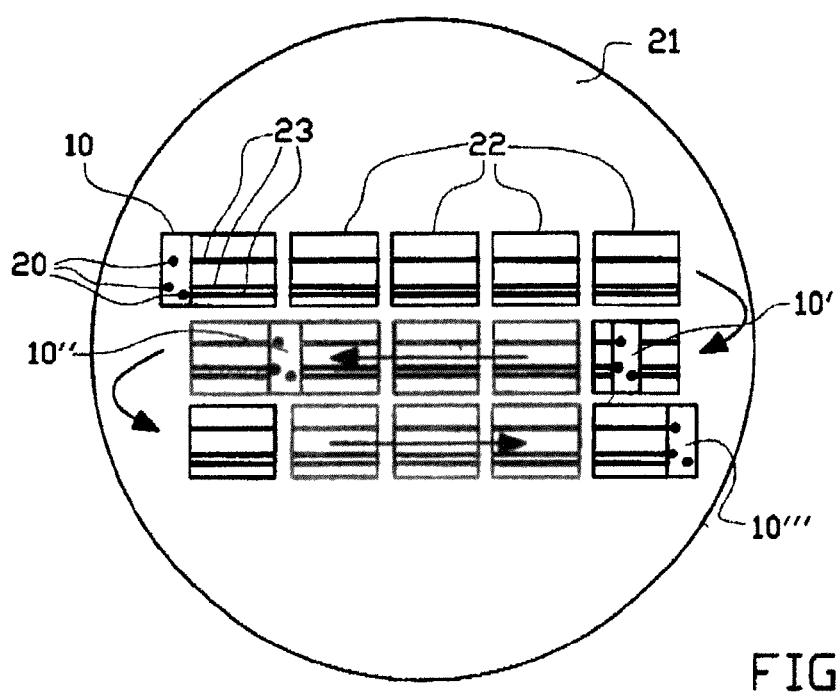
FIG. 3 shows a wafer during a first scan.

FIG. 3 shows a wafer 21 onto which patterns are written for fields 22. The electron optical unit and the wafer surface are scanned with respect to one another, and several positions 10', 10", 10''' are indicated in order to illustrate the scanning over the wafer 21. In practise, wafer 21 will be displaced, allowing a next row of fields 22 to be scanned. The amount displacement of the wafer 21 with respect to the rest of the lithography system will be the width of a field 22.

In FIG. 3 the effect of writing a wafer using a lithography system with three beamlets 20 that are out of spec as indicated in FIG. 2 is demonstrated: Features which happen to be on these three lines of a pattern, indicated with reference number 23, are not correctly written on all the fields 22. Thus, with only three beamlets out of spec, the entire wafer may already be useless.

Figure 4:
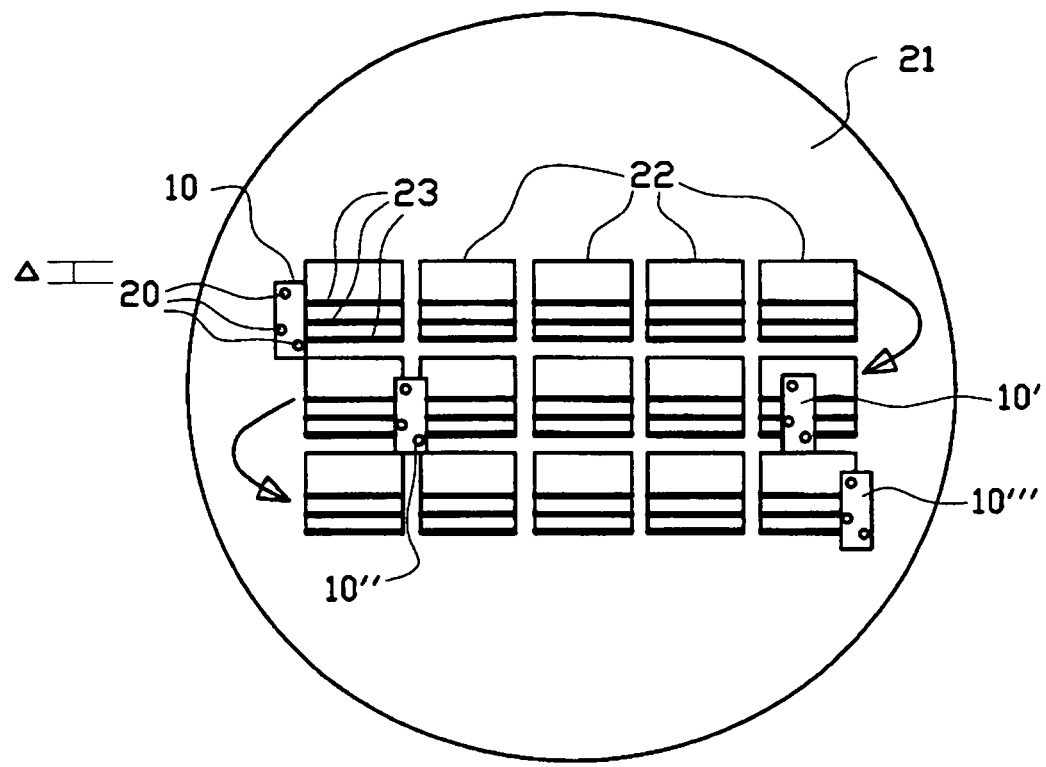
FIG. 4 shows a wafer during a second, redundant scan.

One first way of solving this problem is to allow an additional scan or, in case the lithography system is a single scan system, a second scan, as is shown in FIG. 4. In this additional scan, the position of the electron optical unit 18 and the substrate surface are shifted with respect to one another over a distance A in such a way that the area that was covered by the failing beamlets in the first scan of FIG. 3, can now be covered by beamlets that are actually working or are within specification. The shift is indicated with reference number 24 and is in the direction that is indicated with S2 in FIG. 2. This shift may be the result of a shift of wafer 21, or of a shift of for instance beamlet stop array 10, or of the entire electron optical unit 18 with respect to the wafer. During this additional scan, the lines 23 which were not written due to the beamlets 20 which were out of spec, are now written using other beamlets that are in spec. In that case, the shift 24 has to be determined to be such that the positions of every beamlet 20 that is out of specification is now taken by a beamlet that is within specification.

One way of performing the additional scan is to first scan the first row of fields 22, than go back over the first row to the starting point. The actuator 16 shifts the wafer and the rest of the lithography system with respect to one another according an integer times the mutual distance of the beamlets before the reverse scanning starts. During the reverse scan of the row, missing lines or dots are written. A wafer stepper or stage than moves the wafer and the electron optical unit of the lithography system with respect to one another in order to write the next row of fields 22. This procedure is repeated until a complete wafer is finished. The pattern data for the missing lines and dots can be prepared while the first scan of a row is done. Alternatively according to the invention, the entire wafer may be scanned before the additional scan is performed.

Figure 5:
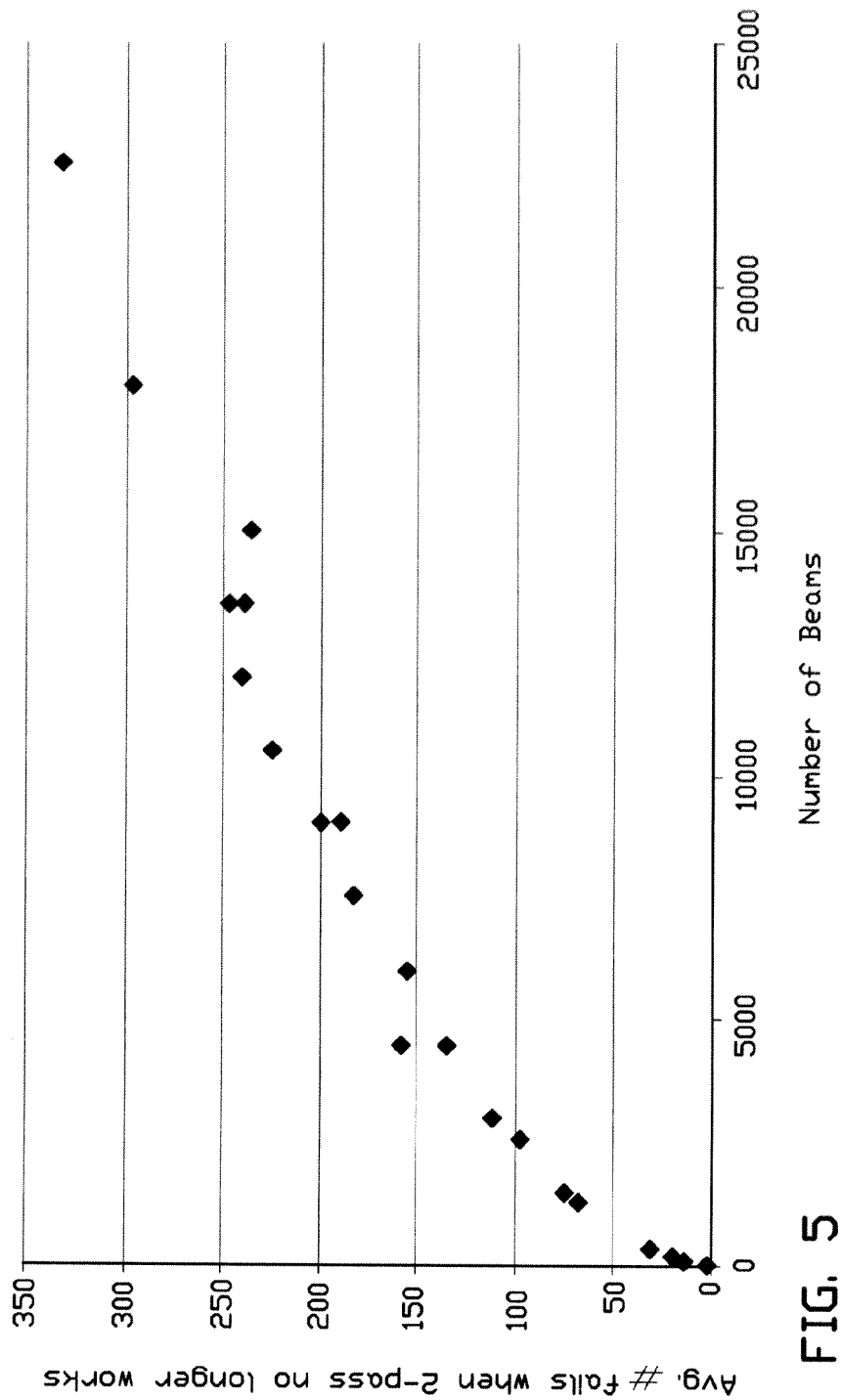
FIG. 5 shows a graph resulting from an analysis of the effect of beamlet failure.

FIG. 5 shows a graph resulting from a Monte Carlo simulation to analyse the effectiveness of an additional scan. The graph shows on the x-axis the total number of beamlets of the lithography system which are used to write a pattern, and on the y-axis the average number of failing beamlets which were present in the lithography system when an additional scan was not sufficient to compensate for every defective beamlet of for every beamlet which was out of specification (and as a result, was switched off).

FIG. 5 thus indicates how many beamlets, of all beamlets present in the system, may fail before an additional scan is unable to compensate for the missing beamlets. It can be seen that when using for instance 13,000 beamlets, a failure of about 250 beamlets results in at least one non-written scan line when applying a second scan or an additional scan according to an aspect of the invention.

Figure 6:
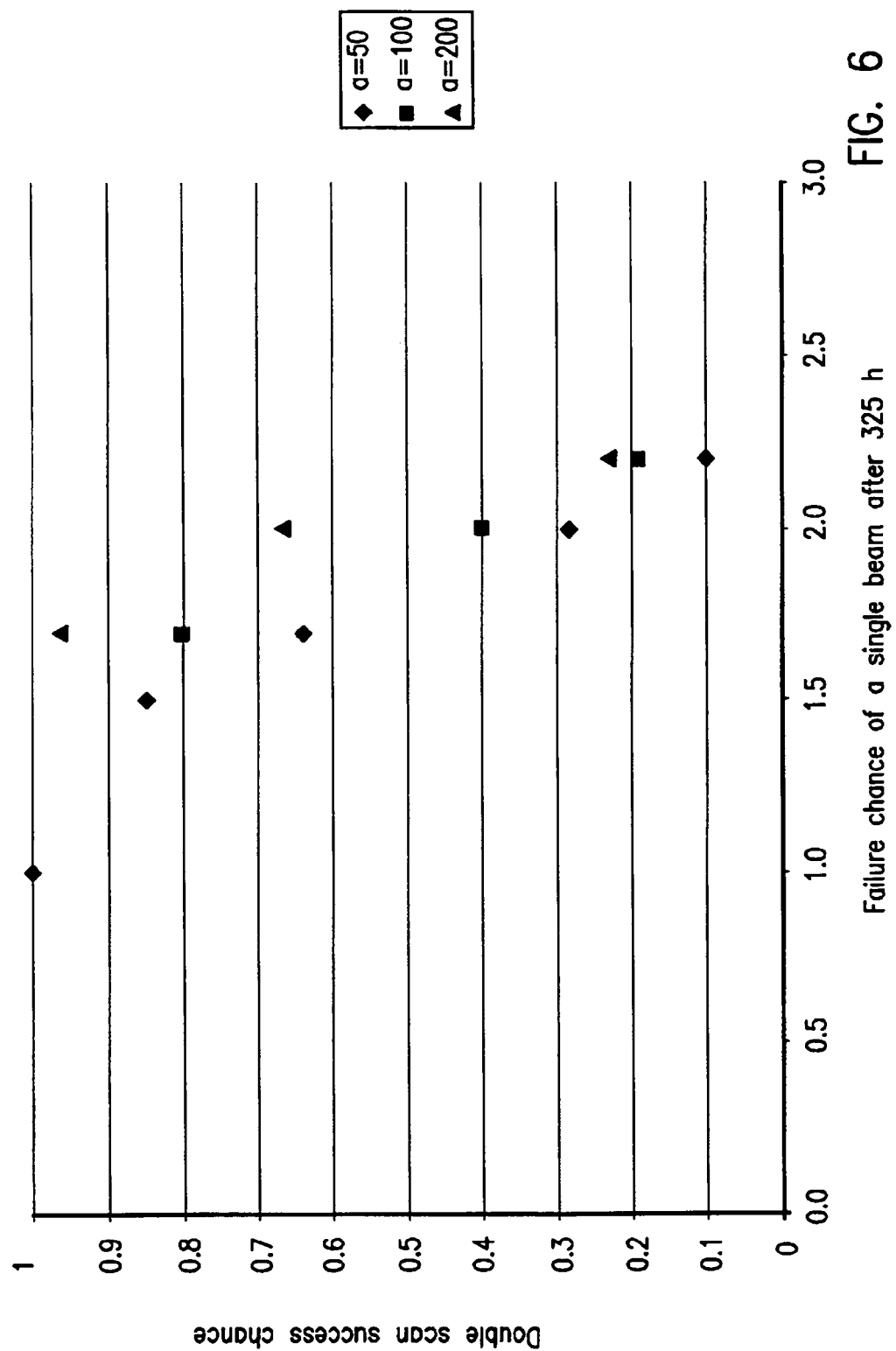
FIG. 6 shows a graph resulting from an analysis of the influence of beamlet reliability.

FIG. 6 shows an analysis of the probability on success of a double scan implementation when adding 50, 100 and 200 extra beamlets to (for instance) 13,000 beamlets of a beamlet generator. In this analysis, the x-axis indicates the probability of failure (%) of a single beamlet after 325 hour. The different symbols represent, respectively, 50, 100 and 200 additional beamlets.

FIGS. 7A and 7B show a further aspect of the current invention. In FIG. 7A, electron beamlet properties are measured using a detector. Electron beamlets are scanned over the detector and electronic beamlet data of all the beamlets are collected. The measurement is completed by deriving values for various properties such as spot size and position of each beamlet from said data by a calculator, here included in the controller. Next, the beamlets having a value for any one of the measured set of properties outside a predefined range of values for said property are determined, as invalid. The positions of these beamlets are stored in the control unit 60 of FIG. 1. During writing, these beamlets are switched off or permanently blanked.

After writing a pattern onto the wafer, using one or more scans, the control unit calculates the shift of the wafer with respect to the electron optical unit that is needed to assure that each beamlet which was switched off because it was out of spec is replaced with a beamlet that is within spec, or that those parts of the pattern which were not written because beamlets were switched off, are now written. Next, an additional scan is performed.

The lithography system of FIG. 1 with the free space coupling or projection of the pattern data transmission provides additional opportunities. If only the electron optical system or part 18, indicated with the stripped line in FIG. 1, is shifted with respect to the wafer 13, the light optical beam or beams 14 remain at the same position with respect to the wafer 13, but are also shifted with respect to the electron optical unit 18. In some of the designs of the lithography system, the electron optical unit 18 has one or more electrostatic deflectors for each beamlet. Each deflector has a light sensitive element and the optical transmitter transmits a light beam dedicated to each light sensitive element. In other designs of such a lithography system, one light beam comprises the pattern data for all deflectors. Such a light beam may hold a plurality of frequency-multiplexed light beams, for instance.

In these examples of lithography systems in which pattern data is projected into the electro optical unit 18 using one or more light beams, control unit 60 only re-transmits that part of the pattern that should have been written by the beamlets which were out of spec: the shift of the electron optical unit 18 places beamlets that are within spec in the place of beamlets which were out of spec. In that case, control unit 60 does not need to re-load pattern data, which saves time.

In another embodiment in accordance with the present invention, the stage 24 is used for shifting the wafer 13. An advantage is that the stage 24 is already present in the system and thus the system does not need an additional actuator for repositioning the wafer 13 and the electron optical unit 18 with respect to one another. The control unit 60 now calculates the desired position of the wafer 13 and sends instructions to the wafer stage 24. In this case, however, according to the invention, there are several options to assure that the proper pattern data reaches the right beamlet, or, better worded: the right part of the pattern is produced on the right part of the wafer 13.

One option is for the control unit 60 to re-calculate which part of the pattern data needs to be send, and to which part of the electron optical unit 18. The control unit 60 now selects the right optical beams, and transmits the new data using the selected light beams.

Another option is for the control unit 60 to calculate where the beamlets are that now replace the out of spec beamlets which were switched off. The control unit 60 subsequently calculates in what way the projection system has to be shifted to make sure that these beamlets receive the pattern data which was originally transmitted to out of spec beamlets. The control unit 60 is now able to re-send only that part of the pattern data.

Figure 8:
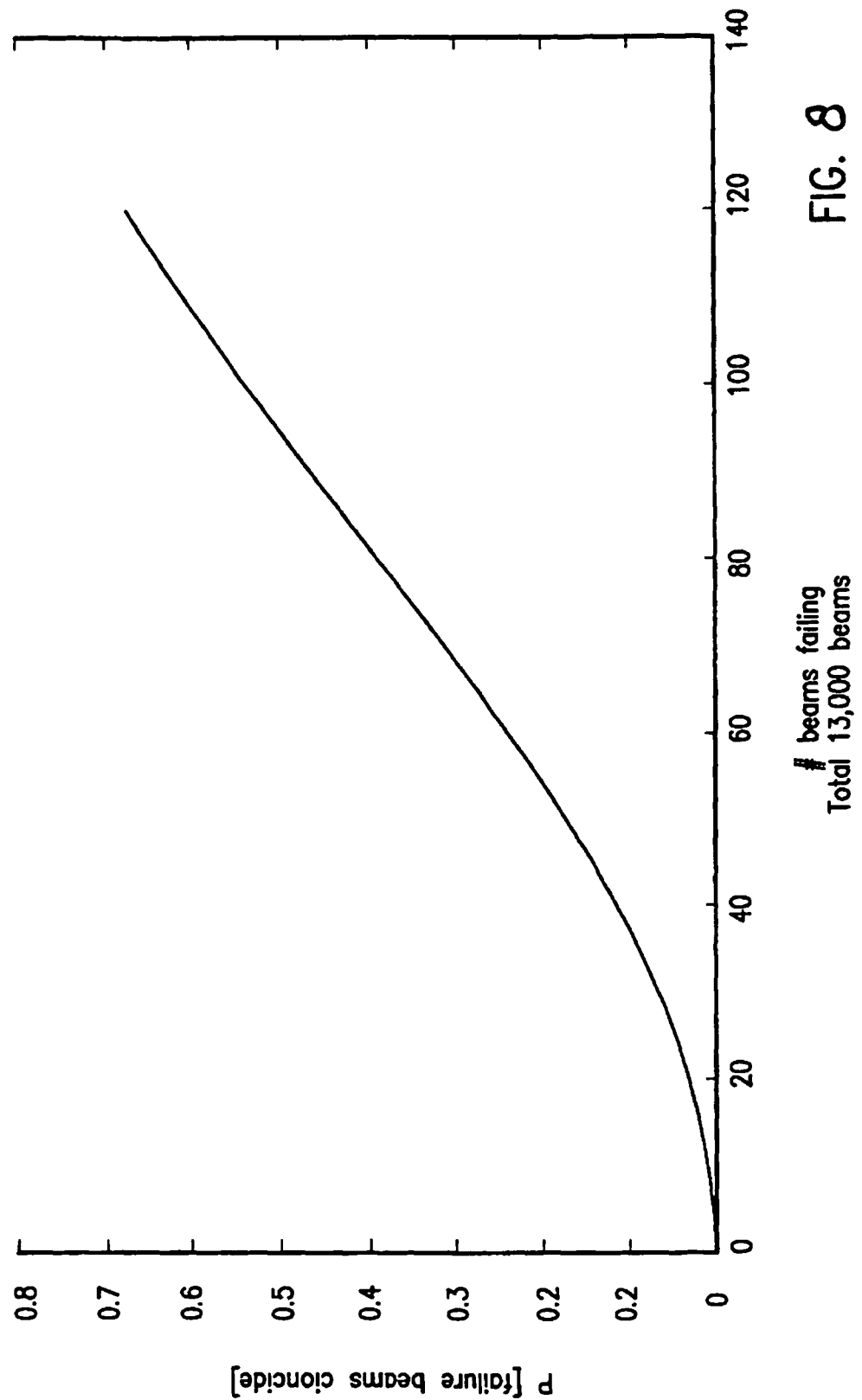
FIG. 8 shows a graph illustrating the probability of failing beamlets being neighbouring beamlets.

FIG. 8 shows a graph indicating the probability that failing beamlets are neighbouring beamlets in a lithography system with, for example, 13000 beamlets. It should be borne in mind that when an additional scan according to the present invention is used to compensate for failing beamlets, or to when a set of additional beamlets is added to the system, this will not completely compensate when neighbouring beamlets fail when a shift over a distance of only the mutual distance of neighbouring beamlets is performed. The system should therefor have the flexibility of shifting an integer number times the mutual distance of neighbouring beamlets. To this end, the lithography system preferably has computing means for finding neighbouring failing beamlets, determining the maximum number of adjacent failing beamlets and calculating means for determining the integer number. If, for instance, three adjacent neighbouring beamlets fail, the shift should be at least four times the mutual distance of neighbouring beamlets.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

The invention claimed is:

1. A method for transferring a pattern onto a surface of a target using a maskless multi-beamlet lithography system, comprising the steps of:
    generating a plurality of beamlets;
    measuring a property of each beamlet;
    determining those beamlets of said plurality of beamlets which have a value for the property outside a predefined range of values for said property as invalid beamlets, and those beamlets of said plurality of beamlets which have a value for the property inside the predefined range of values for said property as valid beamlets;
    switching off or permanently blanking said invalid beamlets, thus preventing invalid beamlets from reaching said surface;
    during a first scan of a first row, moving the target with respect to the rest of the system along the first row in a scanning direction (S1) and, during said movement, writing said pattern onto said surface by using said valid beamlets of said plurality of beamlets, wherein a part of said pattern at positions of said invalid beamlets is not correctly written;
    subsequently shifting said surface and at least part of said lithography system with respect to one another, wherein the magnitude of said shift is such that each invalid beamlet is replaced by a replacement beamlet, wherein said replacement beamlet is one of said valid beamlets of said plurality of beamlets, wherein said shift being performed in a shifting direction (S2) substantially transverse to said scanning direction (S1) over a distance, such that the positions that were covered by invalid beamlets are in a second scan covered by replacement beamlets;
    during the second scan of said first row, moving the target with respect to the rest of the system along said first row of said first scan, and, during said movement, original, unmodified pattern data of said invalid beamlets for said first scan is used for controlling said replacement beamlets during said second scan; and
    alter said second scan displacing said target for allowing a next row to be scanned.

2. The method for transferring a pattern onto a surface of a target according to claim 1, further comprising the step of:
    providing a controller with pattern data:
    storing information for identifying said invalid beamlets;
    separately modulating each beamlet in dependence of said pattern data by means of a modulator which is controlled by said controller.

3. The method for transferring a pattern onto a surface of a target according to claim 2, wherein for the second scan the controller re-transmits the original, unmodified pattern data of said invalid beamlets for said first scan to the modulator to control said replacement beamlets.

4. The method for transferring a pattern onto a surface of a target according to claim 2, wherein the shift of said beamlet optical unit and said target with respect to one another in a shifting direction (S2) transverse to said scanning direction (S1) is induced by an actuator, wherein said actuator is operationally coupled with said control unit and is adapted for inducing said shift, thereby positioning valid beamlets over the position of invalid beamlets.

5. The method for transferring a pattern onto a surface of a target according to claim 4, wherein the actuator is a stage which is used to displace the target with respect to an electron optical unit of said lithography system.

6. The method for transferring a pattern onto a surface of a target according to claim 4, wherein the beamlets are regularly spaced and wherein said actuator is adapted for mutually displacing or shifting an integer times the mutual distance of two neighbouring beamlets.

7. The method for transferring a pattern onto a surface of a target according to claim 6, wherein the lithography system has computing means for finding neighbouring invalid beamlets, determining the maximum number of adjacent invalid beamlets, and calculating the integer number for shilling an integer times the mutual distance of two neighbouring beamlets.

8. The method for transferring a pattern onto a surface of a target according to claim 4, wherein at least part of said beamlets are regularly spaced and arranged along a line (s) which is at a small angle α with respect to the scanning direction (S1), and wherein said actuator is adapted for inducing said shift in said shifting direction (S2) which shill has a distance which is an integer times d*sin(α), wherein d is a mutual distance between two adjacent beamlets.

9. The method for transferring a pattern onto a surface of a target according to claim 8, wherein the lithography system has computing means for finding neighbouring invalid beamlets, determining the maximum number or adjacent invalid beamlets, and calculating the integer number for shifting an integer times d*sin(α), wherein d is a mutual distance between two adjacent beamlets.

10. The method for transferring a pattern onto a surface of a target according to claim 1, wherein the number of beamlets generated for transferring a pattern is less than the number of beamlets that can be generated within the lithographic system.

11. A maskless multi-beamlet lithography system for transferring a pattern onto a surface of a target, comprising:
  at least one beamlet optical unit for generating a plurality of beamlets;
  at least one measuring unit for measuring a property of each beamlet;
  at least one control unit operationally coupled to said measuring unit for determining those beamlets of said plurality of beamlets which have a value for the property outside a predefined range of values for said property as invalid beamlets, and those beamlets of said plurality of beamlets which have a value for the property inside the predefined range of values for said property as valid beamlets wherein the control unit is arranged for switching off or permanently blanking said invalid beamlets, thus preventing invalid beamlets from reaching said surface;
  at least a stage for during a first and a second scan of a first row, moving the target with respect to the rest of the system along the first row in a scanning direction (S1); and
  at least one actuator for inducing a shift of said surface and at least part of said lithography system with respect to one another, wherein said shift being performed in a shifting direction (S2) substantially transverse to said scanning direction (S1) over a distance, such that the positions that were covered by invalid beamlets are in a second scan covered by replacement beamlets wherein said control unit is arranged for:
  during a first scan of a first row, moving the target with respect to the rest of the system along the first row in a scanning direction (S1) and, during said movement, writing said pattern onto said surface by using said valid beamlets of said plurality of beamlets, wherein a part of said pattern at positions of said invalid beamlets is not correctly written;
  subsequently shifting said surface and at least part of said lithography system with respect to one another, wherein the magnitude of said shift is such that each invalid beamlet is replaced by a replacement beamlet, wherein said replacement beamlet is one of said valid beamlets of said plurality of beamlets, wherein said shift being performed in a shifting direction (S2) substantially transverse to said scanning direction (S1) over a distance, such that the positions that were covered by invalid beamlets are in a second scan covered by replacement beamlets;
  during the second scan of said first row, moving the target with respect to the rest of the system along said first row of said first scan, and, during said movement, original, unmodified pattern data of said invalid beamlets for said first scan is used for controlling said replacement beamlets during said second scan.

12. The maskless multi-beamlet lithography system for transferring a pattern onto a surface of a target according to claim 11, wherein for the second scan the controller re-transmits the original, unmodified pattern data of said invalid beamlets for said first scan to a modulator to control said replacement beamlets.

13. The maskless multi-beamlet lithography system for transferring a pattern onto a surface of a target according to claim 11, wherein the stage which is used to displace the target with respect to an electron optical unit of said lithography system comprises said actuator.

14. The maskless multi-beamlet lithography system for transferring a pattern onto a surface of a target according to claim 11, wherein the beamlets are regularly spaced and wherein said actuator is adapted for mutually displacing or shifting an integer times the mutual distance of two neighbouring beamlets.

15. The maskless multi-beamlet lithography system for transferring a pattern onto a surface of a target according to claim 14, wherein the lithography system has computing means for finding neighbouring invalid beamlets, determining the maximum number of adjacent invalid beamlets, and calculating the integer number for shifting an integer times the mutual distance of two neighbouring beamlets.

16. The maskless multi-beamlet lithography system for transferring a pattern onto a surface of a target according to claim 11, wherein at least part of said beamlets are regularly spaced and arranged along a line (s) which is at a small angle α with respect to the scanning direction (S1), and wherein said actuator is adapted for inducing said shift in said shifting direction (S2) which shift has a distance which is an integer times d*sin(α), wherein d is a mutual distance between two adjacent beamlets.

17. The maskless multi-beamlet lithography system for transferring a pattern onto a surface of a target according to claim 16, wherein the lithography system has computing means for finding neighbouring invalid beamlets, determining the maximum number of adjacent invalid beamlets, and calculating the integer number for shifting an integer times d*sin(α), wherein d is a mutual distance between two adjacent beamlets.

18. The maskless multi-beamlet lithography system for transferring a pattern onto a surface of a target according to claim 11, wherein the number of beamlets generated for transferring a pattern is less than the number of beamlets that can be generated within the lithographic system.

* * * * *

UNITED STATES PATENT AND TRADEMARK OFFICE
CERTIFICATE OF CORRECTION

PATENT NO. : 8,890,095 B2  
APPLICATION NO. : 11/492572  
DATED : November 18, 2014  
INVENTOR(S) : Stijn Willem Herman Karel Steenbrink, Pieter Kruit and Marco Jan-Jaco Wieland Page 1 of 1

It is certified that error appears in the above-identified patent and that said Letters Patent is hereby corrected as shown below:

In the Claims,

Column 11, Claim 7, line 2, please delete "shilling" and insert --shifting--.

Column 11, Claim 8, line 10, please delete "shill" and insert --shift--.

Column 11, Claim 9, line 16, please delete "or" and insert --of--.

Signed and Sealed this  
Twelfth Day of May, 2015

Michelle K. Lee  
*Director of the United States Patent and Trademark Office*